United States Patent
Shimamura

(10) Patent No.: US 7,178,012 B2
(45) Date of Patent: Feb. 13, 2007

(54) SEMICONDUCTOR DEVICE

(75) Inventor: Akimitsu Shimamura, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 377 days.

(21) Appl. No.: 10/602,640

(22) Filed: Jun. 25, 2003

(65) Prior Publication Data

US 2004/0004869 A1    Jan. 8, 2004

(30) Foreign Application Priority Data

Jun. 25, 2002   (JP) .............................. 2002-183754

(51) Int. Cl.
*G06F 9/38* (2006.01)
(52) U.S. Cl. .................................... 712/234
(58) Field of Classification Search .................. 712/234
See application file for complete search history.

(56) References Cited

U.S. PATENT DOCUMENTS 5,918,045 A    6/1999  Nishii et al.
6,119,221 A *  9/2000  Zaiki et al. .................. 712/237
6,260,138 B1 * 7/2001  Harris ......................... 712/239
6,609,194 B1 * 8/2003  Henry et al. ................. 712/238
2002/0099910 A1 7/2002  Shah

FOREIGN PATENT DOCUMENTS

JP    2001-172504    6/2000

* cited by examiner

*Primary Examiner*—William M. Treat
(74) *Attorney, Agent, or Firm*—Steptoe & Johnson LLP

(57) ABSTRACT

An object of the present invention is to provide a semiconductor device that can prevent performance degradation due to wasted execution cycles. According to the present invention, a fetch is performed in an information fetch block (IFB 2) on the basis of the status of a branch-taken signal (BRTKN 9) provided from an execution block (EXB 4), wherein if a conditional branch is taken, the IFB 2 selects a branch target address and if not, the IFB 2 selects an address of the next instruction. The IFB 2 then provides the selected address to an instruction memory (1) to control the fetch in accordance with the address.

6 Claims, 17 Drawing Sheets

FIG. 2

| | a | b | c | | d | e | f |
|---|---|---|---|---|---|---|---|
| ADR | 0000 | 0002 | 0004 | 0022 | 0024 | | |
| IF | SUB D2,D1 | BEQdisp8 | AND D0,D1 | MOV D2,A0 | | | |
| DEC | | SUB D2,D1 | BEQdisp8 | | MOV D2,A0 | | |
| EX | | | SUB D2,D1 | | BEQdisp8 | MOV D2,A0 | |
| BRTKN | | | | | | | |

F I G. 4

| | a | b | c | | d | e | f |
|---|---|---|---|---|---|---|---|
| ADR | 0000 | 0002 | 0004 | 0022 | 0024 | | |
| IF | SUB D2,D1 | BEQdisp8 | AND D0,D1 | MOV D2,A0 | | | |
| DEC | | SUB D2,D1 | BEQdisp8 | | MOV D2,A0 | | |
| EX | | | SUB D2,D1 | | BEQdisp8 | MOV D2,A0 | |
| BRTKN | | | | | | | |
| BREN | | | | | | | |

FIG. 6

| | a | b | c | d | e | f |
|---|---|---|---|---|---|---|
| ADR | 0000 | 0002 | 0004 | 0024 | | |
| XDEC | 00 | 00 | 00 | 00 | | |
| YDECN | 00 | 02 | 04 | 24 | | |
| YDECB | | | 22 | | | |
| BRTKN | | | | | | |
| XDECP | | | | | | |
| YDECP | | | | | | |
| 31 | | | | | | |
| 32 | | | | | | |
| 33 | | | | | | |
| 34 | | | | | | |
| 37 | | | | | | |
| 38 | | | | | | |
| IF | SUB D2,D1 | BEQdisp8 | MOV D2,A0 | | | |
| DEC | | SUB D2,D1 | BEQdisp8 | MOV D2,A0 | | |
| EX | | | SUB D2,D1 | BEQdisp8 | MOV D2,A0 | |

F I G. 7
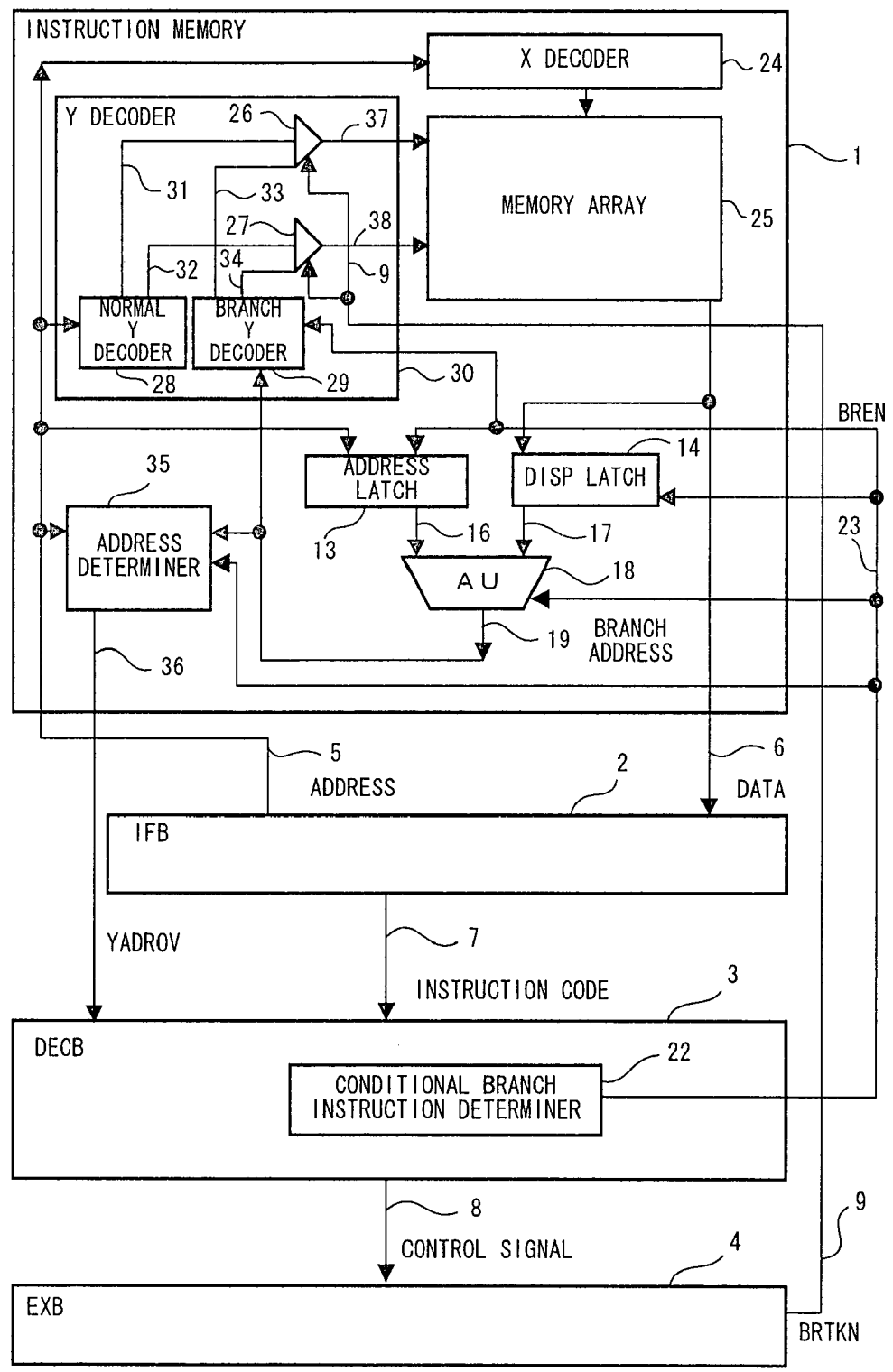

FIG. 8

| | a | b | c | d | e | f |
|---|---|---|---|---|---|---|
| ADR | 0000 | 0002 | 0004 | 0024 | | |
| XDEC | 00 | 00 | 00 | 00 | | |
| YDECN | 00 | 02 | 04 | | | |
| YDECB | | | 22 | | | |
| BRTKN | | | | | | |
| XDECP | | | | | | |
| YDECP | | | | | | |
| 31 | | | | | | |
| 32 | | | | | | |
| 33 | | | | | | |
| 34 | | | | | | |
| 37 | | | | | | |
| 38 | | | | | | |
| IF | SUB D2,D1 | BEQdisp8 | MOV D2,A0 | | | |
| DEC | | SUB D2,D1 | BEQdisp8 | MOV D2,A0 | | |
| EX | | | SUB D2,D1 | BEQdisp8 | MOV D2,A0 | |
| BREN | | | | | | |

FIG. 10

| | a | b | c | d | e | f |
|---|---|---|---|---|---|---|
| ADR | 0000 | 0002 | 0004 | 0024 | | |
| XDEC | 00 | 00 | 00 | 00 | | |
| YDECN | 00 | 02 | 04 | | | |
| YDECB | | | 22 | | | |
| BRTKN | | | ⎾ | | | |
| 39 | 00 | 02 | 04 / 02 | | | |
| XDECP | ⎍ | ⎍ | ⎍ | ⎍ | ⎍ | ⎍ |
| YDECP | ⎍ | ⎍ | ⎍ | ⎍ | ⎍ | ⎍ |
| 37 | | | | | | |
| 38 | | | ⎾ | | | |
| IF | SUB D2,D1 | BEQdisp8 | MOV D2,A0 | | | |
| DEC | | SUB D2,D1 | BEQdisp8 | MOV D2,A0 | | |
| EX | | | SUB D2,D1 | BEQdisp8 | MOV D2,A0 | |

FIG. 12

| | a | b | c | d | e | f |
|---|---|---|---|---|---|---|
| ADR | 0000 | 0002 | 0004 | 0024 | | |
| XDEC | 00 | 00 | 00 | 00 | | |
| YDECN | 00 | 02 | 04 | | | |
| YDECB | | | 22 | | | |
| BRTKN | | | ⎍ | | | |
| 39 | 00 | 02 | 04 | 22 | | |
| XDECP | ⎍ | ⎍ | ⎍ | ⎍ | ⎍ | ⎍ |
| YDECP | ⎍ | ⎍ | ⎍ | ⎍ | ⎍ | ⎍ |
| 37 | | | | | | |
| 38 | | | ⎍ | | | |
| IF | SUB D2,D1 | BEQdisp8 | | MOV D2,A0 | | |
| DEC | | SUB D2,D1 | BEQdisp8 | MOV D2,A0 | | |
| EX | | | SUB D2,D1 | BEQdisp8 | MOV D2,A0 | |
| BREN | | | ⎍ | | | |

F I G. 1 6
a0:0000 0000 0011 1000 0000
a1:0000 0000 0011 1000 0010
a2:0000 0000 0100 0000 0000
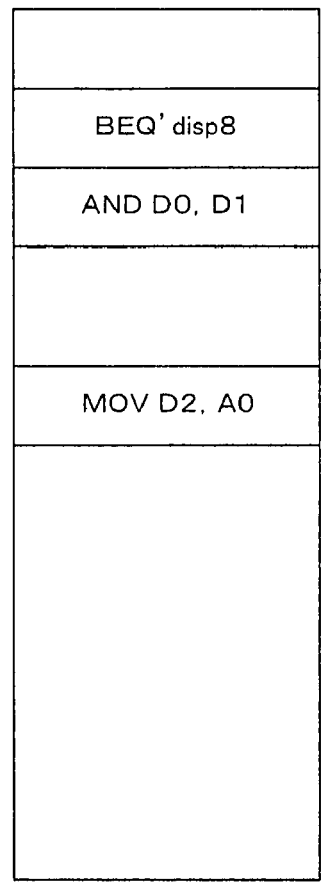

F I G. 1 7
a0: 1000 0000 0000 0000 0000
a1: 1000 0000 0000 0000 0010
a2: 1000 0000 0000 1000 0000
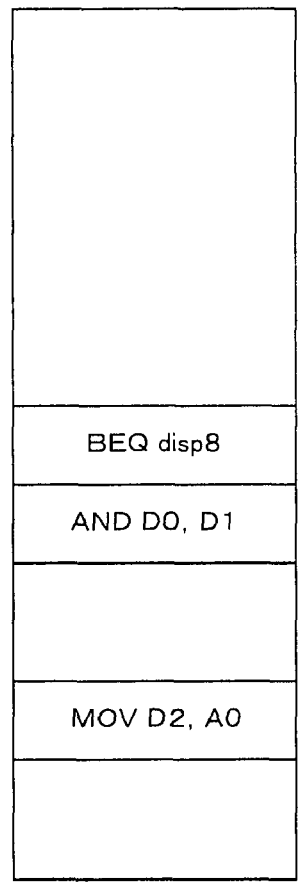

ary-art semiconductor device consists of an instruction memory 1 storing as data an instruction program consisting of instruction codes, an instruction fetch block (hereinafter abbreviated to IFB) 2 for fetching instruction program data 6 from the instruction memory 1, a decode block (hereinafter abbreviated to DECB) 3 for decoding an instruction code 7 constituting the instruction program, and an execution block (hereinafter abbreviated to EXB) 4 for executing an instruction according to a control signal 8 associated with a decoded instruction.

SEMICONDUCTOR DEVICE

FIELD OF THE INVENTION

The present invention relates to a semiconductor device that controls handling and execution of conditional branches according to instructions in memory for data processing.

BACKGROUND OF THE INVENTION

Semiconductors, which have been widely used for data processing for performing various processes according to instruction programs stored in a memory, controls execution of conditional branches in such a manner that when a conditional branch that branches to an address depending on whether or not the branch is taken is performed, an instruction fetch is performed for the predicted conditional branch and, if the branch is taken and the predicted and performed instruction fetch is right, the operation is continued, or if it is wrong, the operation is aborted and the instruction is re-executed.

One such prior-art semiconductor device will be described with reference to FIGS. 13 and 14.

FIG. 13 is a block diagram showing a configuration of a semiconductor device according to a prior art. As shown in FIG. 13, the prior-art semiconductor device consists of an instruction memory 1 storing as data an instruction program consisting of instruction codes, an instruction fetch block (hereinafter abbreviated to IFB) 2 for fetching instruction program data 6 from the instruction memory 1, a decode block (hereinafter abbreviated to DECB) 3 for decoding an instruction code 7 constituting the instruction program, and an execution block (hereinafter abbreviated to EXB) 4 for executing an instruction according to a control signal 8 associated with a decoded instruction.

In this configuration, an address 5 is inputted from the IFB 2 into the instruction memory 1, the data 6 is outputted from the instruction memory 1 to the IFB 2, the instruction code 7 is outputted from the IFB 2 to the DECB 3, the control signal 8 is outputted from the DECB 3 to the EXB 4, and a conditional-branch-taken signal (hereinafter abbreviated to BRTKN) 9 is inputted from the EXB 4 to the IFB 2 and the DECB 3. A system clock signal CLK is inputted into each block and pipeline processing is performed in accordance with the timing of the same CLK.

An operation for handling and executing a conditional branch instruction performed in the prior-art semiconductor device configured as describe above will be described below.

FIG. 14 is a timing diagram of executing a conditional branch instruction in the prior-art semiconductor device. In the period a in FIG. 14, a subtraction SUB D2, D1 is fetched in IFB 2.

In the period b, a conditional branch instruction BEQ disp8 is fetched in the IFB 2 and the SUB D2, D1 is decoded in the DECB 3. The conditional branch instruction BEQ disp8 causes a branch if a zero flag is set to 1 by the previous flag changing instruction. That is, the instruction causes the branch when the result of an operation is zero and otherwise causes the next instruction to be executed without causing a branch.

In the period c, the next, normal instruction AND D0, D1 is fetched in the IFB 2, the BEQ disp8 is decoded in the DECB 3, and the SUB D2, D1 is executed in the EXB 4. If the result of the operation is zero (the zero flag is set to 1), a conditional-branch-taken signal BRTKN 9 is generated in the period c (the HI level).

In the period d, the branch target instruction MOV D2, A0 is fetched in the IFB 2 in accordance with the BRTKN 9. Although the AND D0, D1, which has been fetched based on the prediction that the branch would not be taken, is decoded in the DECB 3, the BEQ disp8 is executed in the EXB 4. That is, the decoding of the MOV D2, A0 in the DECB 3 is cancelled in accordance with the BRTKN 9.

In the period e, the branch target instruction MOV D2, A0 is decoded in the DECB 3 and no operation is performed in the EXB 4 because the decoding of the AND D0, D1 has been canceled.

In the period f, the branch target instruction MOV D2, A0 is executed.

In such a prior-art semiconductor device described above has the problem that if a predicted instruction fetch is performed but the prediction is wrong, that is, if the conditional branch is taken, the execution of the instruction fetched is cancelled and therefore the execution cycle is wasted by the execution of the mispredicted instruction fetch, leading to performance degradation.

DISCLOSURE OF THE INVENTION

The present invention has been made to solve the problem and the object of the present invention is to provide a semiconductor device that can prevent performance degradation due to the occurrence of wasted execution cycle that is inherent in the prior art.

According to the first aspect of the present invention, there is provided a semiconductor device comprising: an instruction memory storing an instruction program consisting of instruction codes, the instruction program being stored as data associated with an address; an instruction fetch block for fetching the instruction program data; a decode block for decoding the instruction codes; and an execution block for executing a decoded instruction according to a control signal associated with the decoded instruction; wherein the address is provided from the instruction fetch block to the instruction memory, the instruction program data at the address is inputted from the instruction memory to the instruction fetch block, the instruction code associated with the instruction program data is inputted from the instruction fetch block to the decode block, the control signal associated with the instruction decoded from the instruction code is inputted from the decode block into the execution block, a conditional-branch-taken signal indicating a status of a conditional branch is outputted from the execution block, the status depending on a result of the execution of the instruction according to the control signal, and the execution of the conditional branch is controlled according to the instruction program in the instruction memory, the execution depending on the conditional-branch-taken signal; and the semiconductor device comprising a controller for selecting one of a branch target address to be used if the conditional branch is taken and an address to be used if the conditional branch is not taken on the basis of a state of the conditional-branch-taken signal and providing the address to the instruction memory during a fetch performed by the instruction fetch block.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the second aspect of the invention is the semiconductor device according to the first aspect of the invention, wherein the branch target address is generated from displacement information included in the instruction program data.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the third aspect of the invention is the semiconductor device according to the second aspect, further comprising a determiner for determining a conditional branch instruction on the basis of the instruction code provided from the instruction fetch block, wherein the execution of the conditional branch instruction is detected on the basis of a result of the determination, and only when the conditional branch instruction is executed, the address selection based on the conditional-branch-taken signal is made.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the fourth aspect of the invention is the semiconductor device according to the second aspect of the invention, wherein the instruction memory consists of memory cells arranged in two-dimensional arrays for two-dimensionally addressing the addresses in the instruction memory, and the conditional-branch-taken signal is provided as an address selection signal to the output of one of two address decoders, each of which being associated with each of the two-dimensional arrays, the one of the two address decoder being determined after the other.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the fifth aspect of the invention is the semiconductor device according to the second aspect of the invention, wherein the instruction memory consists of memory cells arranged in two-dimensional arrays for two-dimensionally addressing the addresses in the instruction memory, and the conditional-branch-taken signal is provided as an address selection signal to the input of one of the two address decoders, each of which being associated with each of the two-dimensional arrays, the one of the two-address decoder being determined after the other.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the sixth aspect of the invention is the semiconductor device according to the third aspect, wherein the instruction memory consists of memory cells arranged in two-dimensional arrays for two-dimensionally addressing the addresses in the instruction memory, and the conditional-branch-taken signal is provided as an address selection signal to the output of one of the two address decoders, each of which being associated with each of the two-dimensional arrays, the one of the two-address decoders being determined after the other.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the seventh aspect of the invention is the semiconductor device according to the third aspect, wherein the instruction memory consists of memory cells arranged in two-dimensional arrays for two-dimensionally addressing the addresses in the instruction memory, and the conditional-branch-taken signal is provided as an address selection signal to the input of one of the two address decoders, each of which being associated with each of the two-dimensional arrays, the one of the two address decoders being determined after the other.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

The semiconductor device according to the eighth aspect of the invention is the semiconductor device according to the third aspect, wherein the instruction memory consists of memory cells arranged in two-dimensional arrays for two-dimensionally addressing the addresses in the instruction memory, and the address of a conditional branch instruction and the address of a branch target instruction are mapped by a linker so that an address input into one of the address decoders associated with the two-dimensional arrays remains the same, the one of the address decoders being determined before the other, and an address input into the other address decode changes.

According to this configuration, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

In summary, the address selection based on the state of the branch-taken signal is made to perform a fetch for a conditional branch instruction. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented.

Furthermore, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented and address selection other than that for fetching a conditional branch instruction is also eliminated. Thus, the wasteful power consumption is avoided, leading to reduction in the power consumption of the entire device.

Moreover, the instruction memory consists of memory cells arranged in two-dimensional arrays for two-dimensionally addressing the addresses in the instruction memory, and the address of a conditional branch instruction and the address of a branch target instruction are mapped by a linker so that an address input into one of the address decoders associated with the two-dimensional arrays remains the same, the one of the address decoders being determined before the other, and an address input into the other address decode changes. Thus, wasted cycles, which are inherent in the prior art, can be avoided for all the rearranged conditional branch instructions.

BRIEF DESCRIPTION OF THE DRAWINGS

FIG. 2 is a timing diagram showing an operation of the semiconductor device according to the first embodiment;

FIG. 4 is a timing diagram showing an operation of the semiconductor device according to the second embodiment;

FIG. 6 is a timing diagram showing an operation of the semiconductor device according to the third embodiment;

FIG. 7 is a block diagram of showing a configuration of a semiconductor device according to a fourth embodiment of the present invention;

FIG. 8 is a timing diagram showing an operation of the semiconductor device according to the fourth embodiment;

FIG. 10 is a timing diagram showing an operation of the semiconductor device according to the fifth embodiment of the present invention;

FIG. 12 is a timing diagram showing an operation of the semiconductor device according to the sixth embodiment;

FIG. 16 is a diagram showing address mapping in the semiconductor device according to the seventh embodiment; and FIG. 17 is a diagram showing addresses re-mapped in the semiconductor device according to the seventh embodiment.

DESCRIPTION OF THE EMBODIMENTS

Embodiments of a semiconductor device will be described below with reference to the accompanying drawings.

[First Embodiment]

A semiconductor device according to a first embodiment of the present invention will be described.

Figure 1:
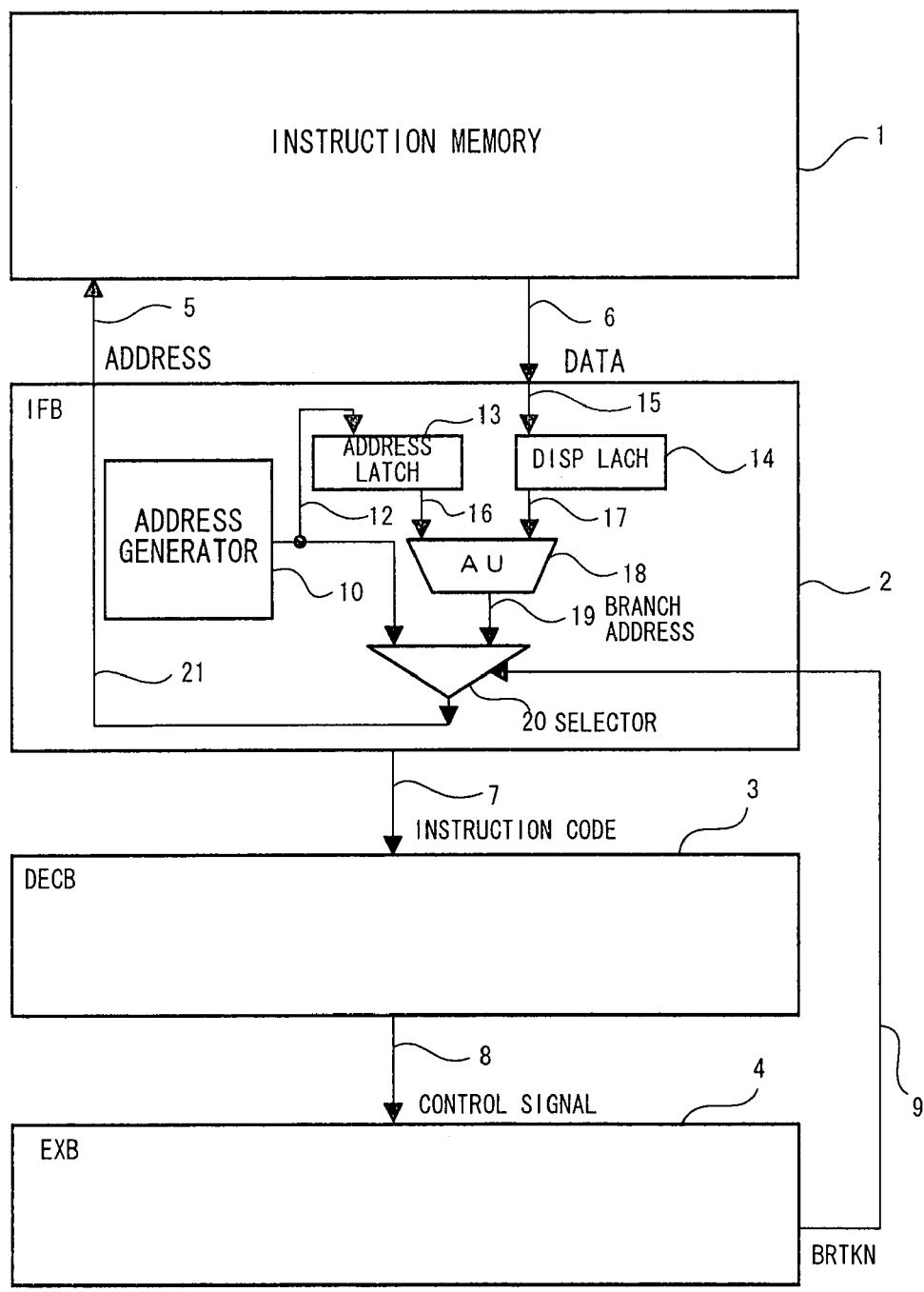
FIG. 1 is a block diagram showing a configuration of a semiconductor device according to a first embodiment of the present invention.

FIG. 1 is a block diagram showing a configuration of the semiconductor device according to the first embodiment. The instruction memory 1, IFB 2, DECB 3, EXB 4, address 5, data 6, instruction code 7, and control signal 8 shown in FIG. 1 are the same as those described with respect to the prior art.

Provided in the IFB 2 is an address generator 10, an address latch 13, a disp latch 14 for holding the displacement information, an arithmetic unit (AU) 18, and selector 20. An output 12 from the address generator 10 is inputted into the address latch 13 and the selector 20. Displacement information 15 extracted from the data 6 is inputted into the disp latch 14, an output 16 from the address latch 13 and an output 17 from the disp latch 14 are inputted into the AU 18, an output 19 from the AU 18 is inputted into the selector 20, a BRTKN 9 is inputted into the selector 20 as a selection signal, and an output 21 from the selector 20 is inputted in to the instruction memory 1 as an address 5.

An operation of the semiconductor device configured as described according to the first embodiment will be detailed below.

FIG. 2 is a timing diagram showing an operation of the semiconductor device according to the first embodiment. In the period a, address (ADR) 0000 is issued, and register-register operations SUB D1 and D2 are fetched in the IFB 2.

In the period b, address 0002 is issued and a conditional branch instruction BEQ disp8 is fetched in the IFB 2 and SUB D2 and D1 are decoded in the DECB 3. At the end of the period b, displacement information 20 included in the BEQ disp8 instruction is held in the disp latch 14 and address 0002 is held in the address latch 13. The conditional instruction BEQ disp8 branches when the result of the previous operation is zero. Otherwise, it executes the next instruction.

In the period c, address 0004 is first issued, the next instruction AND D0, D1 is fetched in the IFB 2, the value 0002 in the address latch 13 and the value 0020 in the disp latch 14 are inputted into the AU 18, which outputs the branch address 19, 0022. BEQ disp8 is decoded in the DECB 3 and SUB D2 and D1 are executed in the execution block 4.

The results of the operations SUB D2 and D1 are zero in the first embodiment. Consequently, a conditional-branch-taken signal BRTKN 9 is generated in the period c. When the BRTKN 9 is inputted in the selector 20, the branch address 19 is selected, the selector output 21 changes to 0022, and the address 5 changes to 0022. Because address 0022 has been issued, instructions MOV D2 and A0 stored at address 0022 are fetched in the IFB 2.

In the period d, the branch target instructions MOV D2, A0 are decoded in the DECB 3 and BEQ disp8 is executed in the EXB 4. However, in effect, no instruction is executed because the conditional branch operation has already been completed.

In the period e, the branch target instructions MOV D2, A0 are executed in the EXB 4.

In this way, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented.

[Second Embodiment]

A semiconductor device according to a second embodiment of the present invention will be described below.

Figure 3:
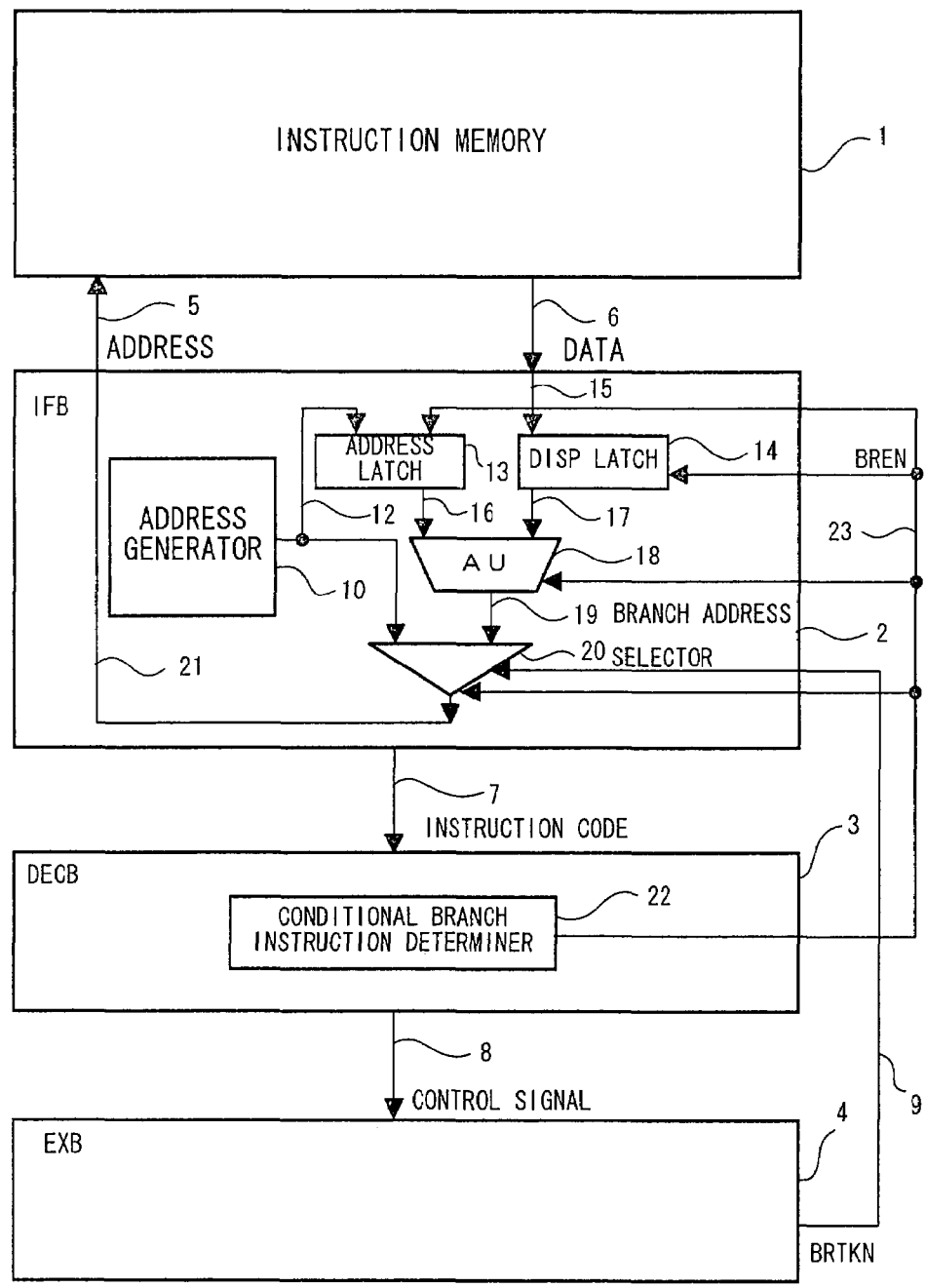
FIG. 3 is a block diagram showing a configuration of a semiconductor device according to a second embodiment of the present invention.

FIG. 3 is a block diagram showing a configuration of a semiconductor device according to the second embodiment. In FIG. 3, the instruction memory 1, IFB 2, DECB 3, EXB 4, address 5, data 6, instruction code 7, control signal 8, BRTKN 9, address generator 10, address 12, address latch 13, disp latch 14, address latch output 16, disp latch output 17, AU 18, branch address 19, selector 20, and selector output 21 are the same as those described with respect to the first embodiment.

Provided in the DECB 3 is a conditional branch instruction determiner 22, which outputs a signal BREN 23 that indicates the execution of a conditional branch instruction when the conditional branch instruction is inputted into the DECB 3. BREN 23 is inputted into the address latch 13, the disp latch 14, the AU 18, and the selector 20. The address latch 13, the disp latch 14, the AU 18, and the selector 20 operate if and only if the BREN 23 is HI (high level).

An operation of the semiconductor device configured as describe above according to the second embodiment will be detailed below.

FIG. 4 is a timing chart showing an operation of the semiconductor device according to the second embodiment. In period c, the BREN 23 goes HI. Only in this period, the address latch 13, disp latch 14, AU 18, and selector 20 operate. On the other hand, during a period in which the BREN 23 is low, the address latch 13, disp latch 14, AU 18, and selector 20 come to a halt. The other operations of these components are the same as those described with respect to the first embodiment.

In this way, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented and address selection other than that for fetching a conditional branch instruction is also eliminated. Thus the wasteful power consumption is avoided, leading to reduction in the power consumption of the entire device.

[Third Embodiment]

A semiconductor device according to a third embodiment of the present invention will be described.

Figure 5:
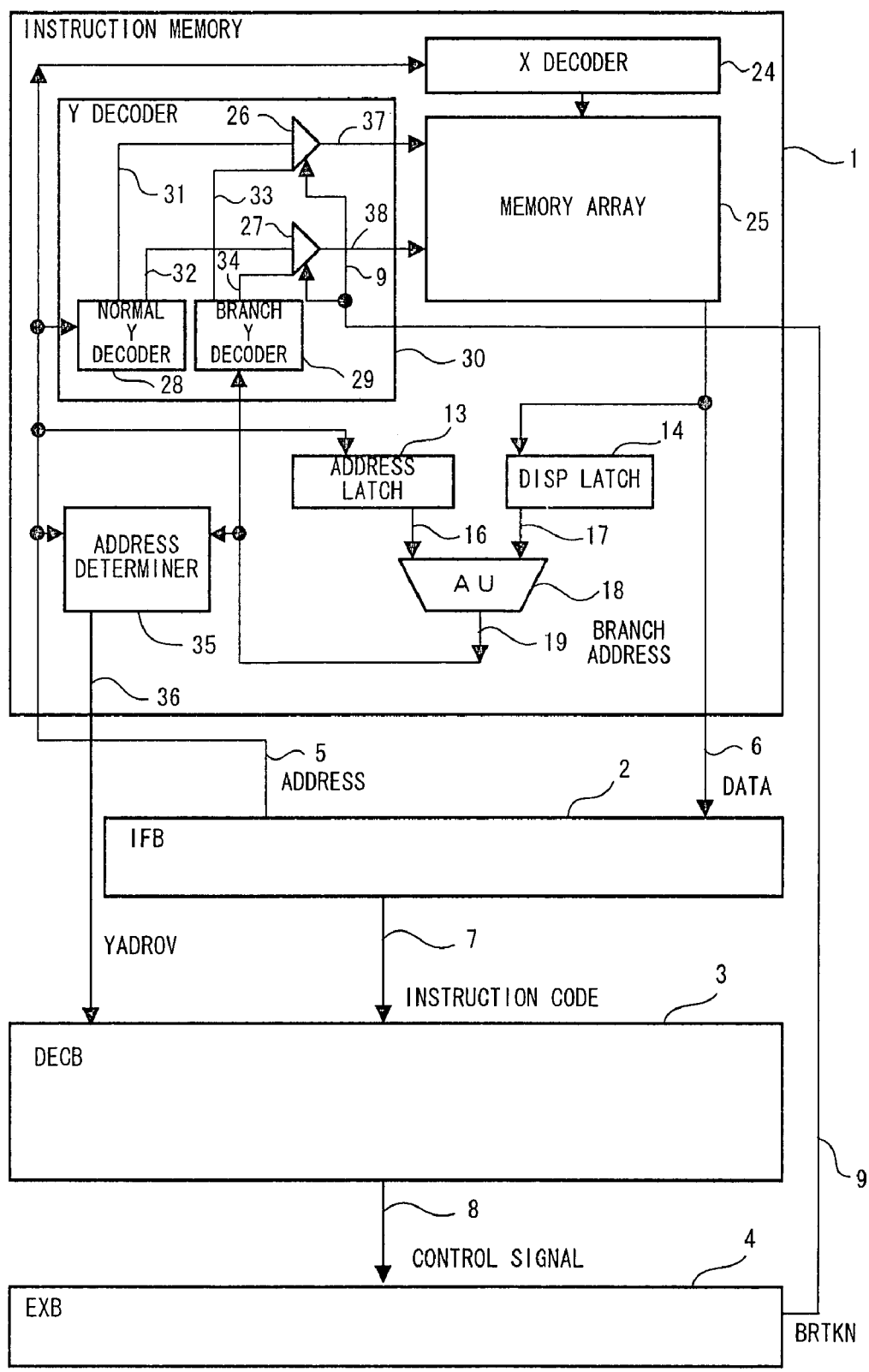
FIG. 5 is a block diagram showing a configuration of a semiconductor device according to a third embodiment.

FIG. 5 is a block diagram showing a configuration of a semiconductor device according to the third embodiment. In FIG. 5, the instruction memory 1, IFB 2, DECB 3, EXB, address 5, data 6, instruction code 7, control signal 8, BRTKN 9, address latch 13, disp latch 14, address latch output 16, disp latch output 17, AU 18, and branch address 19 are the same as those described with respect to the second embodiment.

In the second embodiment, the address latch 13, disp latch 14, and AU 18 are provided in the instruction memory 1. Also provided in the instruction memory 1 are an X decoder 24, a Y decoder 30, and a memory array 25. Provided in the Y decoder 30 are a normal address Y decoder 28, a branch address Y decoder 29, a selector 26 in which a normal Y decoder output 31 and a branch Y decoder output 33 are inputted as input data and BRTKN 9 is inputted as a selection signal, a selector 27 in which a normal Y decoder output 32 and a branch Y decoder output 34 are inputted as input data and BRTKN 9 is inputted as a selection signal, and an address determiner 35 in which a branch address 19 and an address 5 are inputted. An output 37 from the selector 26 and an output 38 from the selector 27 are inputted into the memory array 25 and an output YADROV 36 from the address determiner 35 is inputted into the DECB 3.

An operation of the semiconductor device configured as described above will be detailed below.

FIG. 6 is a timing diagram showing an operation of the semiconductor device according to the third embodiment. In FIG. 6, XDEC indicates the two high-order digits of an address 5 inputted into the X decoder 24, YDECN indicates two low-order digits of the address inputted into the Y decoder 30, XDECP indicates a precharge signal of the X decoder 24, and YDECP indicates a precharge signal of the Y decoder 30. Reference number 37 indicates an output from the selector 26 and reference number 38 indicates an output from the selector 27.

Operations in the intervals a and b in FIG. 6 are the same as those in the second embodiment. In the period c, XDECP and YDECP go high and all outputs from the X decoder 24 and all outputs from the Y decoder are deselected (low level). Then XDECP goes low, the selection line of the X decoder 24 goes HI, and XDECP is inputted into the memory array 25. Then YDECP goes low, the selection line of the Y decoder 30 goes HI, and the YDECP is inputted into the memory array 25.

In the interval C in FIG. 6, the digits 00 are inputted into the X decoder 24, the digits 04 are inputted into the normal Y decoder 28, and the digits 22 are inputted into the branch Y decoder 29. The output 31 from the normal Y decoder 28 goes HI when the normal Y decoder input is 00. The output 32 changes when the input is 22. The output 33 from the branch Y decoder 29 goes HI when the normal Y decoder input is 00 and the output 34 changes when the input is 22. The output 37 from the selector 26 is a selection signal which is outputted and goes HI when the two low-order digits of an address are 00. The output 38 from the selector 27 is a selection signal outputted and goes HI when the two low-order digits of the address are 22.

In the interval c in the third embodiment, the normal Y decoder input is 00 and the branch Y decoder input is 22. The outputs 31 and 34 therefore go HI and the outputs 32 and 33 remain LOW (low level). The selectors 26 and 27 select the normal Y decoder output when BRTKN 9 is LOW, or selects the branch Y decoder output when BRTKN 9 is HI. In the third embodiment, BRTKN goes high. Accordingly, the output from the selector 27 goes HI and the output from the selector 26 remains LOW. This means that the digits 22 are inputted into the Y decoder 30 and therefore the branch target address 0022 is inputted in the memory 25. The address 0004 that is used when the branch is not taken contains the instruction AND D0, D1 and the branch address 0022 contains the instruction MOV D2, A0. Accordingly, the instruction MOV D2, A0 is fetched in the IFB 2.

The remaining of the operation is the same as that in the second embodiment. The branch address 19 and the address 5 are inputted in the address determiner 35. If the X decoder input is changed by the value of the branch address 19, that is, if the two higher-order digits are changed in the present embodiment, YADROV inputted in the DECB 3 goes HI and a conventional conditional branch operation is performed.

The change of the X decoder input can be avoided by mapping the first address of a function including a conditional branch instruction in such a manner that the difference between the values of the branch address 19 and the address 5 does not affect the digits higher than the two lower-order digits by a compiler and a linker.

In this way, the address selection based on the state of the branch-taken signal is made to perform a fetch for a conditional branch instruction. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented.

[Fourth Embodiment]

A semiconductor device according to a fourth embodiment will be described below.

FIG. 7 is a block diagram showing a configuration of a semiconductor device according to the fourth embodiment. In FIG. 7, the instruction memory 1, IFB 2, DECB 3, EXB 4, address 5, data 6, instruction code 7, control signal 8, BRTKN 9, address latch 13, disp latch 14, address output latch 16, disp latch output 17, AU 18, X decoder 24, Y decoder 30, memory array 25, normal Y decoder 28, branch Y decoder 29, normal Y decoder outputs 31 and 32, branch address 19, Y decoder outputs 33 and 34, selectors 26 and 27, selector outputs 37 and 38, and address determiner 35 are the same as those described with respect to the third embodiment.

Provided in the DECB 3 is a conditional branch instruction determiner 22. If a conditional branch instruction is inputted into the DECB 3, the conditional branch instruction determiner 22 outputs a signal BREN 23 that indicates the execution of the conditional branch instruction. The BREN 23 is inputted into the address latch 13, the disp latch 14, the AU 18, address determiner 35, and the branch Y decoder 29. If and only if the BREN23 is HI, the address latch 13, the disp latch 14, the AU 18, the address determiner 35, and the branch Y decoder 29 operate.

An operation of the semiconductor device configured as described above according to the fourth embodiment will be detailed below.

FIG. 8 is a timing diagram showing an operation of the semiconductor device according to the fourth embodiment. In period c in FIG. 8, BREN goes high. The address latch 13, the disp latch 14, the AU 18, the address determiner 35, and the branch Y decoder 29 operate only during this period. During a period in which the BREN is LOW, the address latch 13, the disp latch 14, the AU 18, the address determiner 35, and the branch Y decoder 29 come to a halt. The other operations of these components are the same as those described with respect to the third embodiment.

In this way, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented and address selection other than that for fetching a conditional branch instruction is also eliminated. Thus the wasteful power consumption is avoided, leading to reduction in the power consumption of the entire device.

[Fifth Embodiment]

A semiconductor device according to a fifth embodiment of the present invention will be described below.

Figure 9:
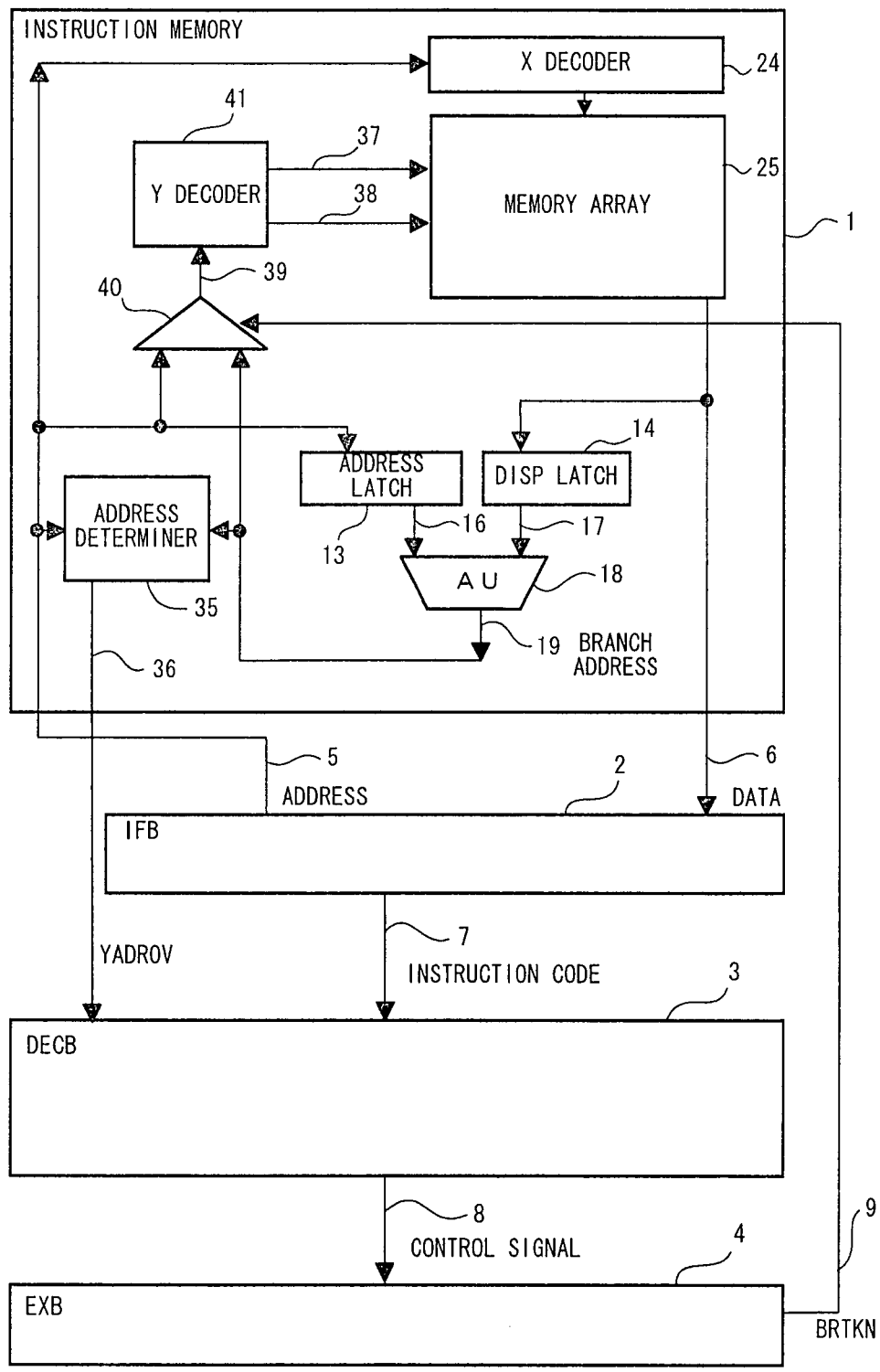
FIG. 9 is a block diagram showing a configuration of a semiconductor device according to a fifth embodiment of the present invention.

FIG. 9 is a block diagram showing a configuration of a semiconductor device according to the fifth embodiment. In FIG. 9, the instruction memory 1, IFB 2, DECB 3, EXB 4, address 5, data 6, instruction code 7, control signal 8, BRTKN 9, address latch 13, disp latch 14, address latch output 16, disp latch output 17, AU 18, X decoder 24, memory array 25, and address determiner 35 are the same as those described with respect to the third embodiment.

The address 5 and the branch address 19 are inputted in the instruction memory 1, the selection signal BRTKN 9 is inputted in the selector 40, and the output 39 of the selector 40 is inputted in the Y decoder 41. The Y decoder output 38 is inputted in the memory array 25.

An operation of the semiconductor device configured as described above according to the fifth embodiment will be detailed below.

FIG. 10 is a timing diagram showing an operation of the semiconductor device according to the fifth embodiment. In FIG. 10, signals ADR, XDEC, YDECN, and YDECB are the same as those in the fourth embodiment. The output 39 from the selector 40 is YDECN, which consists of the two lower-order digits of the normal address 5, when the selection signal BRTKN 9 is HI and becomes YDECB, which consists of the two lower-order digits of the branch address 19 when the BRTKN 9 is LOW.

Inputted from the Y decoder 41 into the memory array 25 are a Y decoder output 37, which goes HI when the Y decoder input 39 is 04 and a Y decoder output 38, which goes HI when the Y decoder input 39 is 22.

At the beginning of the period c, the BRTKN signal is low and therefore the output 39 from the selector 40 is 04. However, YDECP is high during this period. Therefore all outputs from the Y decoder 41 are held low.

When the BRTKN 9 goes HI at a point during the period c, the output 39 of the selector 40 changes to 22. When the YDECP goes low, the Y decoder output 38, which becomes HI when the input 30 into the Y decoder 41 is 22, goes HI. That is, the digits 22 are inputted into the Y decoder 41. This means that the branch target address 0022 is inputted into the memory 25.

An instruction AND D0, D1 is stored at the address 0004 that is used when the branch is not taken, and the instruction MOV D2, A0 is stored at the branch target address 0022. Accordingly, the instruction MOV D2, A0 is fetched in the IFB 2.

The remaining of the operation is the same as that in the third embodiment.

In this way, the address selection based on the state of the branch-taken signal is made to perform a fetch for a conditional branch instruction. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented.

[Sixth Embodiment]

A semiconductor device according to a sixth embodiment of the present invention will be described below.

Figure 11:
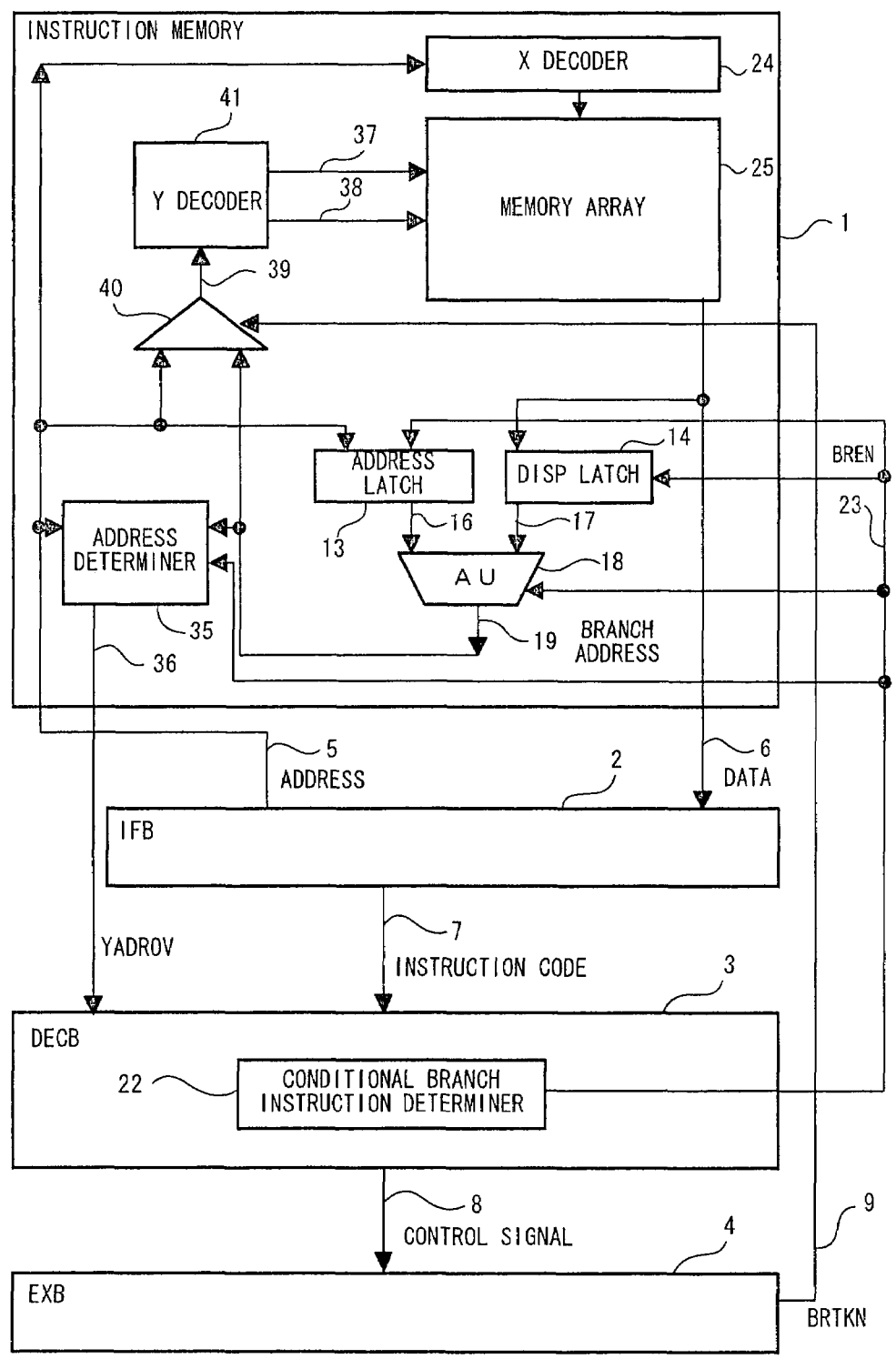
FIG. 11 is a block diagram showing a configuration of a semiconductor device according to a sixth embodiment of the present invention.
Figure 13:
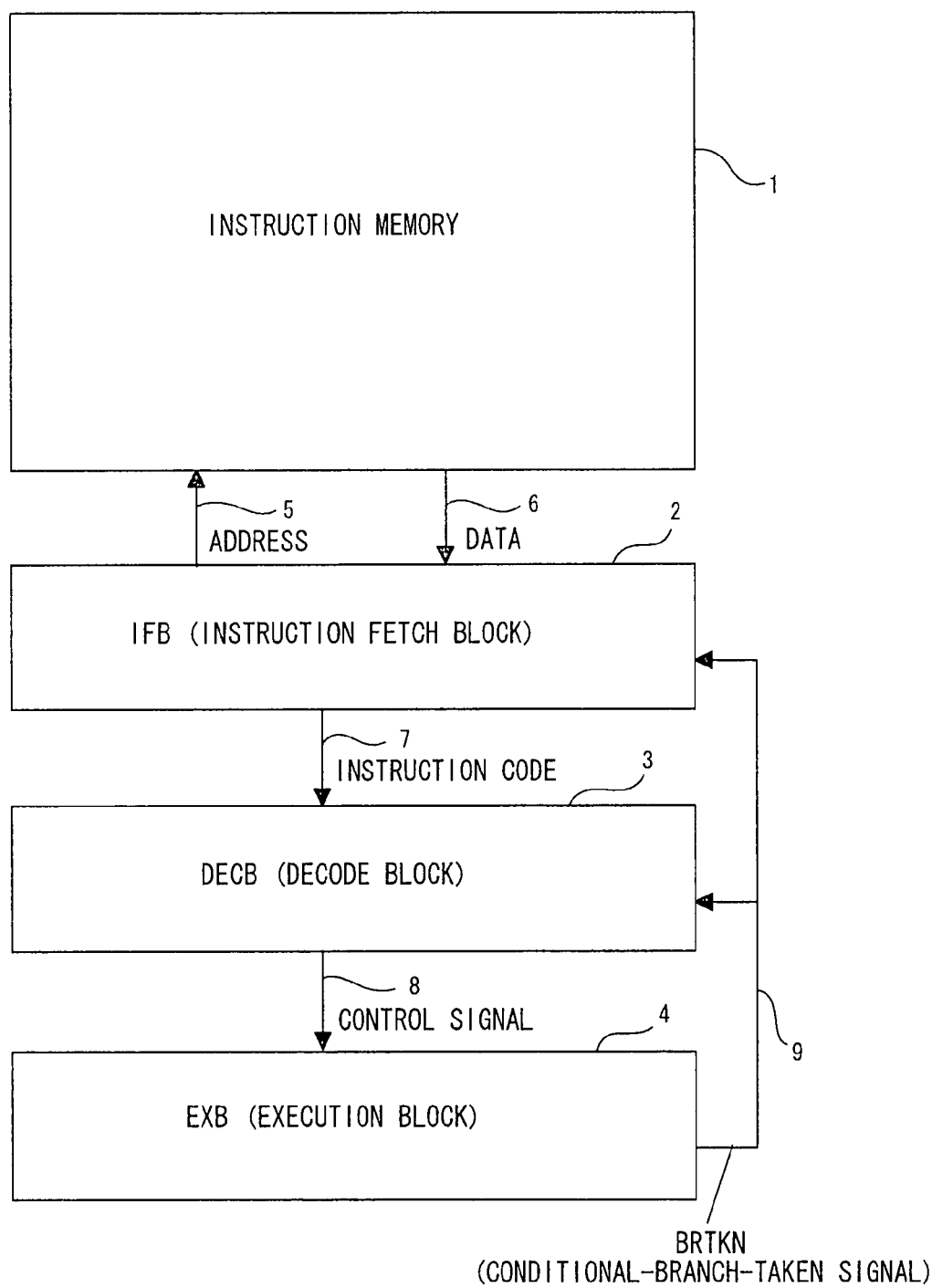
FIG. 13 is a block diagram showing a configuration of an semiconductor device according to the prior art.
Figure 14:
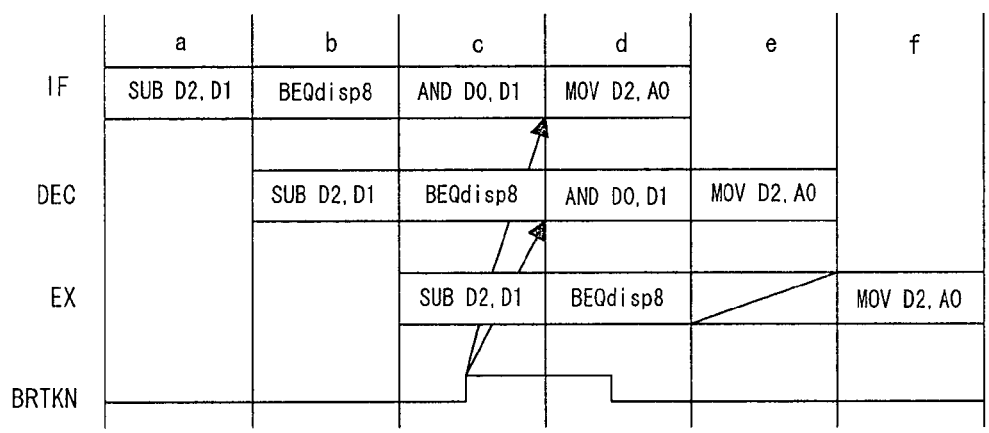
FIG. 14 is a timing diagram of showing an operation of the semiconductor device according to the prior art.

FIG. 11 is a block diagram showing a configuration of a semiconductor device according to the sixth embodiment. In FIG. 11, the instruction memory 1, IFB 2, DECB 3, EXB 4, address 5, data 6, instruction code 7, control signal 8, BRTKN 9, address latch 13, disp latch 14, address latch output 16, disp latch output 17, AU 18, X decoder 24, memory array 25, address determiner 35, selector 40, selector output 39, and Y decoder 41 are the same as those described with respect to the fifth embodiment.

Provided in the DECB 3 is a conditional branch instruction determiner 22. When a conditional branch instruction is inputted into the DECB 3, the conditional branch instruction determiner 22 outputs the signal BREN 23 that indicates the execution of the conditional branch instruction. The BREN 23 is inputted into the address latch 13, the disp latch 14, the AU 18, and the address determiner 35. If and only if the BREN 23 is HI, the address latch 13, the disp latch 14, the AU 18, and the address determiner 35 operate.

An operation of the semiconductor device configured as described above according to the sixth embodiment will be detailed below.

FIG. 12 is a timing diagram showing an operation of the semiconductor device according to the sixth embodiment. In the period C in FIG. 12, the BREN goes HI. The address latch 13, the disp latch 14, the AU 18, and the address determiner 35 operate only during this period. In a period during which the BREN is LOW, the address latch 13, the disp latch 14, the AU 18, and the address determiner 35 come to a halt. The remaining of the operation is the same as that described with respect to the fifth embodiment.

In this way, the address selection based on the state of the branch-taken signal is made to perform a fetch for a conditional branch instruction only when that conditional branch instruction is executed. If the conditional branch is taken, the branch target address is selected. Otherwise, the address of the next instruction is selected. Then the fetch is performed from the selected address. Thus, in contrast to the prior art, cancellation of operations performed on the basis of predictions can be avoided and therefore occurrence of wasted execute cycles can be avoided.

As a result, performance degradation due to such wasted cycles inherent in the prior art can be prevented and address selection other than that for fetching a conditional branch instruction is also eliminated. Thus the wasteful power consumption is avoided, leading to reduction in the power consumption of the entire device.

[Seventh Embodiment]

A semiconductor device according to a seventh embodiment of the present invention will be described.

Address mapping in the semiconductor device according to the seventh embodiment will be described below.

Figure 15:
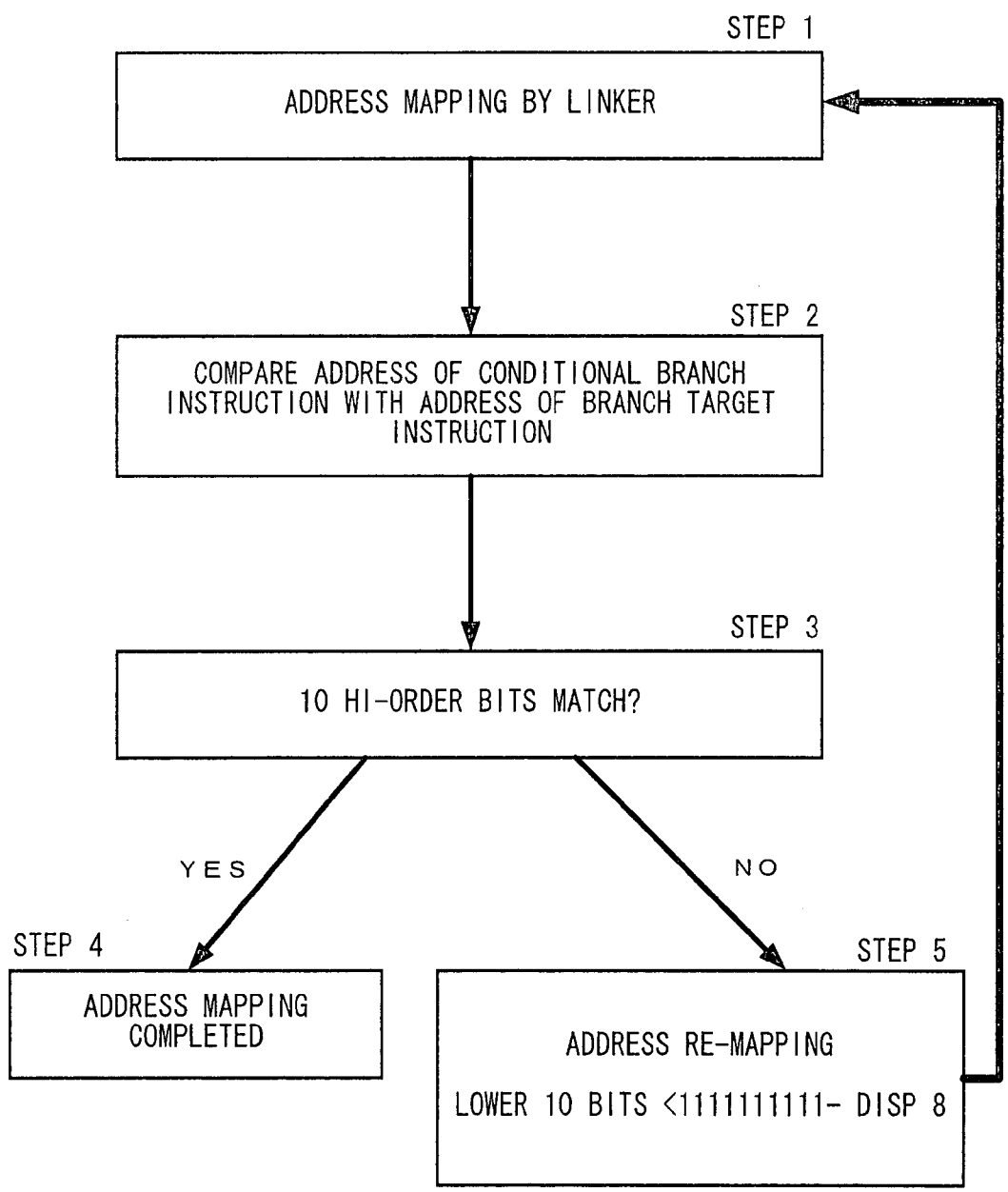
FIG. 15 is a flowchart showing an address mapping performed in a semiconductor device according to a seventh embodiment of the present invention.

FIG. 15 is a flowchart of address mapping in the semiconductor device according to the seventh embodiment. At step 1 in FIG. 15, address mapping of each instruction is performed.

Then the address of each conditional branch instruction is compared with the address of a branch target instruction to which a branch is taken according to that conditional branch instruction at step 2. In the present embodiment, the address of an instruction consists of 20 bits.

If the 10 higher-order bits of the address of the conditional instruction are the same as the 10 higher-order bits of the address of the branch target instruction at step 3, the process proceeds to step 4 and otherwise proceeds to step 5.

Address mapping is completed at step 4. The addresses are remapped to optimize the arrangement of the branch instructions at step 5, then the process returns to step 2.

FIGS. 16 and 17 show an example of address mapping in the semiconductor device according to the seventh embodiment. Shown in FIG. 16 is an address map immediately after address mapping is performed by a linker at step 1 in FIG. 15.

In FIG. 16, a conditional branch instruction BEQ disp8 is mapped to a binary address, 0000 0000 0011 1000 0000. Disp8 of the conditional branch instruction BEQ disp8 is a binary number 1000 0000. Accordingly, the branch target instruction MOV D2, A0 is mapped to a binary address 0000 0000 0100 0000 0000.

At step 2 in FIG. 15, the addresses are compared between the conditional branch instruction and the branch target instruction. It is determined at step 3 whether or not the upper 10 bits are the same. If they are the same, the process proceeds to step 4, otherwise to step 5.

Because they are not the same in this example, the process proceeds to step 5, where the addresses are remapped. According to the present embodiment, the linker controls the arranged addresses of subroutines including conditional branch instructions to arrange the conditional branch instructions so that the addition of the binary number 1000 0000 representing disp8 does not cause a carry into a bit position in the upper 10 bits, that is, so that the lower 10 bits address of the conditional branch instruction is smaller than the value obtained by subtracting disp8 from the maximum value 1111111111 (binary).

FIG. 17 shows the address map after the re-mapping. In FIG. 17, the conditional branch instruction BEQ disp8 is mapped to the binary address 10000000 0000 0000 0000. The branch target instruction MOV D2, A0 is mapped to the binary address 1000 0000 0000 1000 0000.

At step 3 in FIG. 15, it is determined that the upper 10 bits of the addresses are the same. The process proceeds to step 4, where the address mapping ends.

As a result, occurrence of wasted cycles associated with the prior art can be avoided in all the relocated conditional branch instructions and therefore performance degradation can be prevented.

What is claimed is:

1. A semiconductor device comprising:
an instruction memory for storing an instruction program comprising a plurality of instruction codes as data with an address;
an instruction fetch block for specifying an address in the instruction memory, performing a fetch process for fetching an instruction program read out from the instruction memory, and outputting the plurality of codes;
a decode block for decoding, into a control signal, each of the plurality of instruction codes outputted from the instruction fetch block, and outputting such control signal; and
an execution block for executing an instruction according to a control signal outputted from the decode block, and outputting a conditional-branch-taken signal indicating a status of a conditional branch according to a result of execution of such instruction, wherein when the instruction fetch block performs the fetch process, one of an address which is a branch target address for use when a conditional branch is taken and an address for use when such conditional branch is not taken is selected according to a conditional-branch-taken signal outputted from the execution block, and supplied to the instruction memory, wherein the instruction memory comprises an X decoder, a Y decoder and a memory array comprising a plurality of memory cells identified by an output from the X decoder and an output from the Y decoder,
the X decoder having an input address specified by upper bits of a fourth address outputted from the instruction fetch block,
the Y decoder comprising a normal decoder for decoding lower bits of the fourth address outputted from the instruction fetch block,
a branch Y decoder for decoding lower bits of the branch target address having a same bit width as that of lower bits of the fourth address outputted from the instruction fetch block, and
a selector for receiving an output from the normal Y decoder and an output from the branch Y decoder, selecting one of the outputs according to the conditional-branch-taken signal outputted from the execution block and outputting selected output, wherein the lower bits of the fourth address specifying each of the memory cells of the memory array is specified by the output from the selector.

2. A semiconductor device comprising:
an instruction memory for storing an instruction program comprising a plurality of instruction codes as data with an address;
an instruction fetch block for specifying an address in the instruction memory, performing a fetch process for fetching an instruction program read out from the instruction memory, and outputting the plurality of codes;
a decode block for decoding, into a control signal, each of the plurality of instruction codes outputted from the instruction fetch block, and outputting such control signal; and
an execution block for executing an instruction according to a control signal outputted from the decode block, and outputting a conditional-branch-taken signal indicating a status of a conditional branch according to a result of execution of such instruction, wherein when the instruction fetch block performs the fetch process, one of an address which is a branch target address for use when a conditional branch is taken and an address for use when such conditional branch is not taken is selected according to a conditional-branch-taken signal outputted from the execution block, and supplied to the instruction memory, wherein the instruction memory comprises an X decoder, a Y decoder and a memory array comprising a plurality of memory cells identified by an output from the X decoder and an output from the Y decoder, the X decoder and the Y decoder each having an input address set by an output from the instruction fetch block, and
the device further comprising a selector for selecting the branch target address as input address to the Y decoder based on the conditional-branch-taken signal outputted from the execution block, and outputting the selected address, wherein the branch target address is selected based on a displacement information in the instruction program data and the fourth address, lower bits of the fourth address specifying each of the memory cells of the memory array is specified by the output from the Y decoder.

3. A semiconductor device comprising:
an instruction memory for storing an instruction program comprising a plurality of instruction codes as data with an address;
an instruction fetch block for specifying an address in the instruction memory, performing a fetch process for fetching an instruction program read out from the instruction memory, and outputting the plurality of codes;
a decode block for decoding, into a control signal, each of the plurality of instruction codes outputted from the instruction fetch block, and outputting such control signal; and
an execution block for executing an instruction according to a control signal outputted from the decode block, and outputting a conditional-branch-taken signal indicating a status of a conditional branch according to a result of execution of such instruction, wherein when the instruction fetch block performs the fetch process, one of an address which is a branch target address for use when a conditional branch is taken and an address for use when such conditional branch is not taken is selected according to a conditional-branch-taken signal outputted from the execution block, and supplied to the instruction memory, wherein the instruction memory comprises an X decoder, a Y decoder and a memory array comprising a plurality of memory cells identified by an output from the X decoder and an output from the Y decoder, the X decoder having an input address specified by upper bits of a fourth address outputted from the instruction fetch block, the Y decoder comprising a normal Y decoder for decoding a lower bits of the fourth address outputted from the instruction fetch block, a branch Y decoder for decoding a lower bits of the branch target address having a same bit width as that of lower bits of the fourth address outputted from the instruction fetch block, and a selector for receiving an output from the normal Y decoder and an output from the branch Y decoder, selecting one of the outputs according to the conditional-branch-taken signal outputted from the execution block and outputting the selected output, wherein lower bits of the fourth address specifying each of the memory cells of the memory array is specified by the output from the selector.

4. A semiconductor device comprising:

an instruction memory for storing an instruction program comprising a plurality of instruction codes as data with an address;

an instruction fetch block for specifying an address in the instruction memory, performing a fetch process for fetching an instruction program read out from the instruction memory, and outputting the plurality of codes;

a decode block for decoding, into a control signal, each of the plurality of instruction codes outputted from the instruction fetch block, and outputting such control signal; and an execution block for executing an instruction according to a control signal outputted from the decode block, and outputting a conditional-branch-taken signal indicating a status of a conditional branch according to a result of execution of such instruction, wherein when the instruction fetch block performs the fetch process, one of an address which is a branch target address for use when a conditional branch is taken and an address for use when such conditional branch is not taken is selected according to a conditional-branch-taken signal outputted from the execution block, and supplied to the instruction memory, wherein the instruction memory comprises an X decoder, a Y decoder and a memory array comprising a plurality of memory cells identified by an output from the X decoder and an output from the Y decoder, the X decoder and the Y decoder each having an input address set by an output from the instruction fetch block, and the device further comprising a selector for selecting the branch target address as input address to the Y decoder based on the conditional-branch-taken signal outputted from the execution block, and outputting the selected address, wherein the branch target address is selected based on a displacement information in the instruction program data and a fourth address, lower bits of the fourth address specifying each of the memory cells of the memory array is specified by the output from the Y decoder.

5. A semiconductor device comprising:

an instruction memory for storing an instruction program comprising a plurality of instruction codes as data with an address;

an instruction fetch block for specifying an address in the instruction memory, performing a fetch process for fetching an instruction program read out from the instruction memory, and outputting the plurality of codes;

a decode block for decoding, into a control signal, each of the plurality of instruction codes outputted from the instruction fetch block, and outputting such control signal; and an execution block for executing an instruction according to a control signal outputted from the decode block, and outputting a conditional-branch-taken signal indicating a status of a conditional branch according to a result of execution of such instruction, wherein when the instruction fetch block performs the fetch process, one of an address which is a branch target address for use when a conditional branch is taken and an address for use when such conditional branch is not taken is selected according to a conditional-branch-taken signal outputted from the execution block, and supplied to the instruction memory, wherein the instruction memory comprises an X decoder, a Y decoder and a memory array comprising a plurality of memory cells identified by an output from the X decoder and an output from the Y decoder, the X decoder and the Y decoder each having input address set by an output from the instruction fetch block, the Y decoder selects the branch target address based on a displacement information in the instruction program data and the output from the fetch process, and outputs the selected address, thereby designating lower bits of the fourth address for specifying each of the memory cells of the memory array, and the memory array is configured to map a conditional-branch-taken instruction address in each of the instruction codes from the instruction fetch block and a branch target instruction address, so that address inputs to the X decoder become identical and address inputs to the Y decoder alone differ from each other.

6. A linking method for performing address mapping for a memory array in a semiconductor device, said semiconductor device comprising:

an instruction memory for storing an instruction program comprising a plurality of instruction codes as data with an address;

an instruction fetch block for specifying an address in the instruction memory, performing a fetch process for fetching an instruction program read out from the instruction memory, and outputting the plurality of codes;

a decode block for decoding, into a control signal, each of the plurality of instruction codes outputted from the instruction fetch block, and outputting such control signal; and an execution block for executing an instruction according to a control signal outputted from the decode block, and outputting a conditional-branch-taken signal indicating a status of a conditional branch according to a result of execution of such instruction, wherein when the instruction fetch block performs the fetch process, one of an address which is a branch target address for use when a conditional branch is taken and an address for use when such conditional branch is not taken is selected according to a conditional-branch-taken signal outputted from the execution block, and supplied to the instruction memory, the instruction memory comprising a memory array comprising a plurality of memory cells each specified by upper bits and lower bits of a first address, the instruction memory associating, with a second address, an instruction program having a plurality of instruction codes, upper bits and lower bits of the second address being designated in the memory array to perform the instruction program read out from the memory array of the instruction memory, said method comprising:

comparing a conditional branch instruction address and a branch target instruction address, each address specifies an instruction program stored in a memory array of an instruction memory, determining whether upper bits of the conditional branch instruction address and the upper bits of the branch target address differ, and re-mapping the branch target instruction address so that no carry into upper bits is caused, thereby optimizing arrangements of the conditional branch instruction address and the branch target instruction address, when upper bits of the conditional branch instruction address and the branch target instruction address differ.

* * * * *